(12) United States Patent
Laufenberg et al.

(10) Patent No.: US 9,418,764 B2
(45) Date of Patent: Aug. 16, 2016

(54) ACTUATOR DEVICE AND PROCESS FOR PRODUCING AN ACTUATOR DEVICE

(75) Inventors: Markus Laufenberg, Radolfzell (DE); Thomas Schiepp, Seitingen-Oberflacht (DE)

(73) Assignee: ETO Magnetic GmbH, Stockach (DE)

( * ) Notice: Subject to any disclaimer, the term of this patent is extended or adjusted under 35 U.S.C. 154(b) by 401 days.

(21) Appl. No.: 13/569,238

(22) Filed: Aug. 8, 2012

(65) Prior Publication Data

US 2013/0038414 A1 Feb. 14, 2013

(30) Foreign Application Priority Data

Aug. 9, 2011 (DE) .......................... 10 2011 052 528

(51) Int. Cl.
*H01F 7/00* (2006.01)
*G12B 1/02* (2006.01)
*H01L 41/12* (2006.01)

(52) U.S. Cl.
CPC *G12B 1/02* (2013.01); *H01L 41/12* (2013.01); *Y10T 29/49874* (2015.01)

(58) Field of Classification Search
CPC ...................................................... H04L 41/12
USPC ........................................................ 335/215
See application file for complete search history.

(56) References Cited

U.S. PATENT DOCUMENTS

| | | | | |
|---|---|---|---|---|
| 5,170,144 A * | 12/1992 | Nielsen | ........................ | 335/229 |
| 6,570,474 B2 * | 5/2003 | Czimmek | ...................... | 335/215 |
| 6,838,965 B1 * | 1/2005 | Von Gaisberg et al. | ...... | 335/274 |
| 7,488,369 B2 * | 2/2009 | Ohashi et al. | .................. | 75/246 |
| 7,579,935 B2 | 8/2009 | Ohta et al. | | |
| 7,880,573 B2 * | 2/2011 | McCoy et al. | ................ | 335/215 |
| 2002/0039060 A1 * | 4/2002 | Maruyama | .................... | 335/220 |
| 2003/0137376 A1 * | 7/2003 | Czimmek | ...................... | 335/215 |
| 2005/0001367 A1 * | 1/2005 | Taya et al. | ..................... | 267/166 |
| 2009/0033448 A1 | 2/2009 | Hoang et al. | | |
| 2010/0242673 A1 | 9/2010 | Laufenberg | | |

FOREIGN PATENT DOCUMENTS

| | | |
|---|---|---|
| EP | 1 598 586 | 11/2005 |
| GB | 2 445 773 | 7/2008 |
| WO | 03/019582 | 3/2003 |

* cited by examiner

*Primary Examiner* — Alexander Talpalatski
(74) *Attorney, Agent, or Firm* — Bachman & LaPointe, PC

(57) ABSTRACT

Actuator device having an expansion unit, which includes a magnetic shape memory alloy material, and a spring unit which interacts therewith in a restoring manner, wherein at least one spring of the spring unit is assigned to the expansion unit, which is designed to perform an expansion movement along an expansion direction, in such a way that the spring can exert a restoring spring force counter to the expansion direction on the expansion unit, and wherein the spring is set up and/or predetermined in its spring characteristic curve properties in such a way that a spring force profile of the spring unit along a stroke range, determined by an expansion force profile of the expansion unit and a restoring spring force profile, of the expansion movement does not form a continuously rising curve, and/or the spring force profile, with respect to a continuously rising curve, extends and/or increases the stroke range.

15 Claims, 7 Drawing Sheets

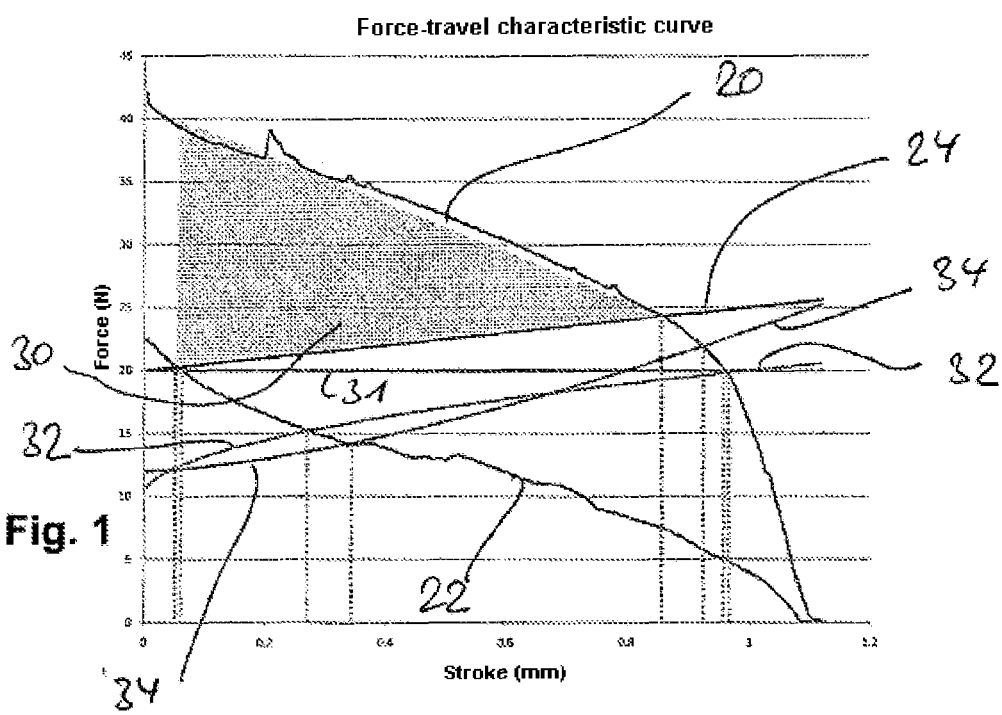
Fig. 1
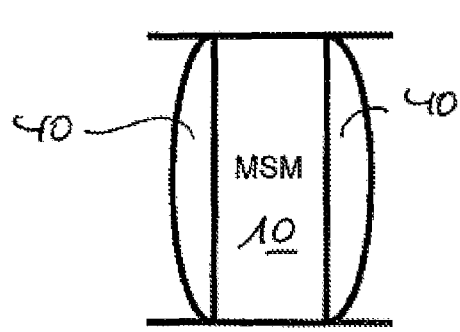
Fig. 2
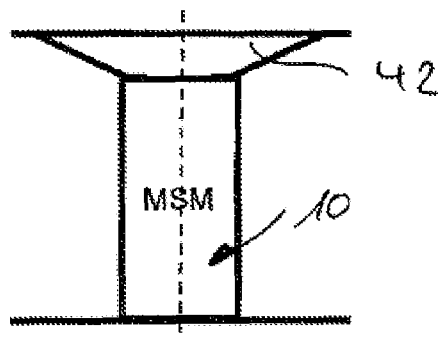
Fig. 3
Fig. 4
Fig. 5
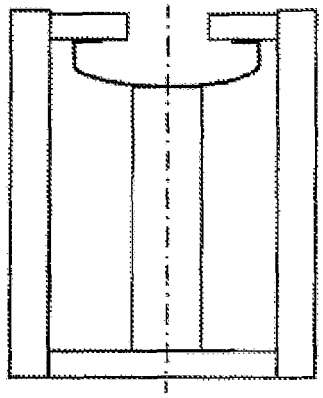
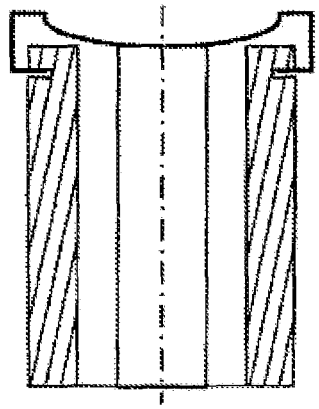

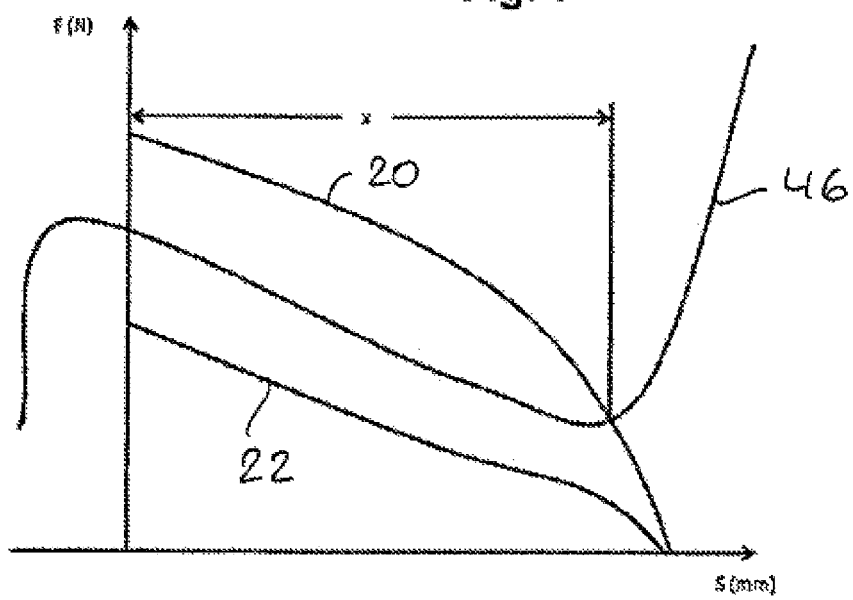
Fig. 6
Fig. 7
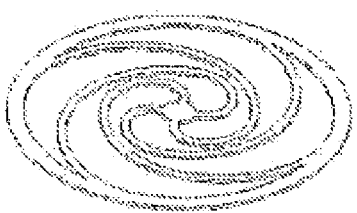
Fig. 8
Fig. 9
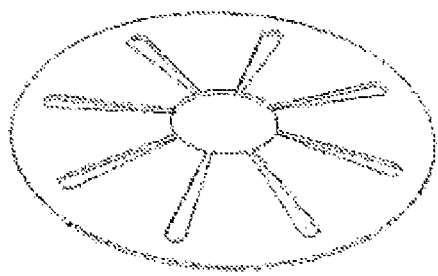
Fig. 10
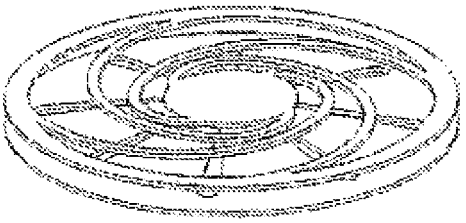

ACTUATOR DEVICE AND PROCESS FOR PRODUCING AN ACTUATOR DEVICE

BACKGROUND OF THE INVENTION

The present invention relates to an actuator device. Furthermore, the present invention relates to a process for producing an actuator device.

It is known from the prior art to use magnetic shape memory (MSM) alloy materials for actuator engineering. For this purpose, as shown schematically in FIG. 19 relating to the supposed prior art, an MSM crystal body (as a representative of a multiplicity of MSM-based materials, for instance foams, polycrystals, composites, etc. and bodies to be manufactured therefrom), typically realized on the basis of an NiMnGa alloy, is exposed to a magnetic field. In the schematic illustration in FIG. 19, in this respect the MSM crystal body 10 shown in elongated form is suitably held between a pair of solenoids 12, which, as illustrated by the line illustration 14, generate a horizontally running field and act on the body 10 therewith. As a reaction to the exposure to a magnetic field, the crystal body 10 performs an expansion movement in the arrow direction 16, and, in a specific application, may interact with an appropriately coupled actuating partner.

Therefore, magnetic shape memory alloy materials of this type and actuator devices realized therewith offer an interesting possibility for replacing or for complementing common actuator principles (such as electromagnetic actuators); in addition to basic simplicity of mechanical design in realizing such devices (no armature moves as a whole, merely an expansion of a body takes place), an advantage of the magnetic shape memory alloy principle used is primarily a potentially quick reaction time of the expansion to the application of a magnetic field of the required strength; in addition, depending on the configuration, actuating forces which are already sufficient for the current state of the art technology for many application purposes can be generated.

Nevertheless, such actuator devices, which are assumed to be known in principle, also entail disadvantages (owing to the principles and construction involved) which to date have restricted a truly universal applicability of such actuators. Thus, for example, a utilizable stroke of the expansion movement (i.e. a degree of elongation of an elongation movement performed by the actuator crystal) is typically limited to approximately 3 to 6% of a corresponding axial extent of the crystal, such that particularly large-stroke movements can only be realized with difficulty by means of shape memory alloy actuators, and therefore there is a need to extend this expansion stroke or to optimize it as far as possible.

In addition, typical shape memory alloy materials have the property that the intended expansion movement takes place as a reaction to a magnetic field (of an appropriate minimum field strength), but after a decline in the magnetic field below this threshold, compression does not then automatically take place back into the original compressed state of the expansion unit realized by means of the shape memory alloy crystal. Instead, the crystal remains in the expanded position even in the event of a decline to below an expansion threshold or in the event of complete deactivation. It has therefore been discussed in the case of devices known from the prior art to realize the restoring (i.e. the resetting of the expansion to the non-expanded starting position) with restoring means which either themselves have a shape memory alloy actuating element (expanding in a correspondingly opposite direction), or alternatively such a restoring device exerting a restoring force in the restoring direction and therefore counter to the expansion direction. If the spring force of such a restoring spring is set, with respect to an (unstressed) expansion force of the shape memory alloy crystal, in such a way that the expansion force exceeds the spring force when the shape memory alloy material is subjected to a magnetic field, the intended expansion movement takes place. In the event that the magnetic field declines, and the expansion force accordingly reduces, the spring force is then above the expansion force, however, and accordingly resets the crystal into the contracted starting position thereof.

This mechanism of action is illustrated on the basis of FIG. 20 relating to the supposed prior art. A shape memory alloy expansion crystal, for instance of a type shown in accordance with FIG. 19, shows, in the force-travel(-stroke) graph shown in FIG. 20, a stroke profile (expansion force profile) as is illustrated in the top curve 20. It can be seen that, with an approximately constant negative pitch, this expansion force profile extends up to approximately 0.9 mm stroke, and then declines steeply. The lower characteristic curve, as a restoring characteristic curve 22, shows the input of force which is required for restoration (resetting) counter to the stroke travel in a state of the crystal in which it is not subjected to a magnetic field.

The shape memory alloy crystal actuator shown in FIG. 20 with reference to the characteristic curves 20, 22 is combined with a restoring spring, which, realized in the form of a typical helical spring, and in a manner which is not shown in the figures, interacts at the face with the crystal 10 and, counter to the arrow direction 16 (FIG. 19), exerts a restoring force on the crystal which is set by the restoring characteristic curve 24, in accordance with a Hooke's straight line 24 which is to be assumed to be potentially idealized.

From the points of intersection between said spring characteristic curve (a typical pitch to be applied in the present stroke range is approximately 5 N/mm) and the stroke characteristic curve 20 or the restoring characteristic curve 22 leads to the effective movement or stroke range, which is limited between a lower stroke limit 26 and an upper stroke limit 28, of the shape memory alloy actuator shown by way of example. Within this range, sufficiently subjecting the crystal to a magnetic field firstly ensures the provision of an actuating force which exceeds the spring force and is therefore sufficient for driving an actuating partner, and at the same time the restoring force of the spring makes it possible, after deactivation of or a decline in the magnetic field, to reset (compress) the expansion body into the starting position thereof within the stroke range slightly above 0. The maximum stroke which thus arises is therefore approximately 0.8 mm in the example.

The graph of FIG. 20 additionally shows, by means of the shaded area 30, the effective expansion work which results from the interaction of the expansion unit (when subjected to a magnetic field) and a restoring force (acting counter to the latter), this being described as the integral of the difference in force of both partners over the effective expansion stroke (i.e. the region between the portions 26 and 28). It not only becomes apparent that this difference in force used for an actuation behavior decreases continuously in the extended (right-hand-side) expansion range, and in this respect provides an actuating partner with increasingly less drive force in the direction towards the expansion direction, but in addition for instance a comparison of the effective expansion work (area 30) relative for instance to the hysteresis difference between the stroke characteristic curve 20 and the restoring characteristic curve 22 in the expansion range (and beyond) shows that only a fraction of the expansion work made possible by the shape memory alloy body can be used, as a result of the interaction with the restoring spring.

SUMMARY OF THE INVENTION

It is an object of the present invention, therefore, to improve an actuator device of the generic type having an expansion unit, which comprises a magnetic shape memory alloy material, and a spring unit which interacts therewith in a restoring manner, in such a way that firstly an effective expansion stroke (i.e. a stroke or expansion distance and also a difference in length of the expansion unit in the compressed state and in the expanded state compared with a spring characteristic curve providing a linear-elastic force profile in interaction with the expansion crystal) is increased, and in addition it is possible to increase an effective expansion work, defined as the area between the expansion force profile of the expansion unit and the spring force profile in the effective expansion stroke range, as compared to interaction of the expansion unit with a spring which provides the linearly rising force profile.

The object is achieved by the actuator device having the features disclosed herein, and furthermore by the process for producing an actuator device disclosed herein. Advantageous developments of the invention are also described herein.

In this case, the "expansion unit" according to the invention means any embodiment of such a shape memory alloy material realized by means of an MSM material, where although an MSM crystal body is a favorable and conventional form of realization, the present invention is not limited thereto. Thus, the invention could be realized by means of any other desired MSM-based materials, for instance composites, foams and polycrystals, if these can be used for actuators in the manner according to the invention.

In a manner which is advantageous according to the invention, the spring unit is set, adapted and selected in a targeted manner by means of at least one spring of said spring unit, both in the actuator device according to the invention and in the process according to the invention for producing the actuator device, in such a way that the spring force profile of the spring unit no longer runs in a manner rising continuously linearly in the stroke range of the expansion unit (i.e. between the compressed state and the expanded state, upon loading by the spring unit), but instead experiences another curve profile, specifically in particular runs horizontally at least in certain portions in the stroke range (i.e. has a pitch 0), or even has a negative pitch, to the extent that it then follows an expansion force profile of the expansion unit which declines with an increasing stroke, and in a particular embodiment follows this profile in a parallel or approximately parallel manner. Spring force profiles which are provided according to the invention and are preferred according to the invention by virtue of a particular configuration or adaptation and preselection of the spring or the spring characteristic curve properties thereof are a degressive curve, i.e. a curve with a pitch (declining) which increases with a rising stroke, and in addition or alternatively a curve which has an extreme value in the stroke range, typically a maximum, after which (with a growing stroke) the spring force declines.

These variants of the invention are shown in the graph in FIG. 1, which, analogously to the illustration in FIG. 20, as a force-travel characteristic curve shows in turn the stroke characteristic curve 20 or the restoring characteristic curve 22 of a shape memory alloy actuator crystal; FIG. 1 also shows the Hooke's linear-elastic spring force characteristic curve 24, which, for instance represented by a helical spring sitting on the crystal on the engagement side, can be described by the linearly rising spring force profile over the stroke, and is applicable as a scale or comparison for the improvements according to the invention: thus, for instance, a constant spring force profile (i.e. pitch=0) symbolized by the horizontal characteristic curve 31 shows how not only, in particular in the right-hand (expanded) stroke range, the point of intersection with the expansion characteristic curve 20 (expansion force profile) can be shifted to the right to extend the effective (utilizable) expansion stroke (the area 30 representing the utilizable expansion work would also be increased by the area growth made possible thereby). The degressively running spring characteristic curve 32, here with a relatively large pitch in the region on the left-hand side, similarly shows a possible way of increasing the effective movement stroke of the overall arrangement (with a further increased stroke work), such as a fundamentally possible curve profile 34 which runs more progressively and therefore non-linearly in certain portions. Therefore, although in general a positive characteristic curve (34) would not lead to an increase in stroke compared to the linear characteristic curve, it would make a relatively large resulting net force possible.

A common feature of all these principles is that, relative to a constant-linear spring force curve, they make it possible, advantageously according to the invention, in particular in the region on the right-hand side (expanded region) of the force-travel characteristic curve, to increase the utilizable movement stroke and/or to increase the area between the expansion force profile and the spring force profile in the effective stroke range (and therefore the stroke work).

For realizing the invention in a preferred manner, numerous procedures lend themselves, where in particular flat springs or springs in the form of leaf springs, disk springs or meandering springs, for instance, have proven to be particularly suitable partners for the expansion unit, for interaction therewith in a manner which is advantageous according to the invention, to affording a non-linear, further preferably declining spring force characteristic curve and in this respect to increasing the stroke range according to the invention.

In this case, it is possible both to realize the desired characteristic curve properties and/or non-linearities of the (at least one) spring by suitable material selection, where for instance rubber materials or plastics materials have proved to be expedient as preferred means for realizing a non-linear characteristic curve profile in a manner according to the invention, and nevertheless it is also encompassed by the invention, according to a further development, to combine a plurality of (individual) springs with one another, where here in particular it is possible to provide these individual springs with in each case different spring characteristic curve properties and then to set or to control the desired behavior of the (overall) spring unit by combination (for instance then addition of the respective characteristic curves).

This applies in particular to those springs or spring combinations in which, according to a further development, an extreme value (i.e. for example a force maximum) is present in the spring force profile within the stroke range. It is therefore possible, for example in the manner of a so-called clicker spring, for such an extreme value (alternatively also a characteristic curve turning point and/or a position of a strong rise or fall) to be set or controlled in accordance with a respective intended actuating task.

Therefore, provision is also made according to a further development to configure a spring (also within a spring combination) at least in certain portions in such a way that it exerts a spring force directed counter to the restoring direction (typically within a part or portion of the stroke range). In this respect, it would then also be possible for this action to be utilized in order to promote, for instance, the expansion of the expansion crystal in a targeted manner and/or to neutralize undesirably strong restoring forces of a neighboring, interacting spring in this region.

These effects of a targeted, potentially region-wise or pointwise non-linearity and/or of an extreme profile within the spring characteristic curve become particularly interesting when two shape memory alloy bodies, typically counter to one another and directed towards one another, interact with one another counter to such spring(s): it is thus possible, for instance, to set multistable positions (i.e. positions which are stable along the stroke range at any desired position), the arrangement of the expansion unit being stable in each position (with the magnetic field deactivated).

As well as the actuator device claimed according to the invention, the process claimed according to the invention for producing an actuator device solves the problem addressed by the invention, i.e. that of predetermining and potentially increasing the (effective) expansion stroke or increasing the achievable expansion work of the actuator device.

As a result, the present invention makes it possible to noticeably improve the range of application and therefore the usability of known, generic actuator devices comprising a shape memory alloy material, where various possible ways of influencing or setting the spring characteristic curve of the interacting restoring spring make it possible to adapt to a multiplicity of applications of actuating partners.

BRIEF DESCRIPTION OF THE DRAWINGS

Further advantages, features and details of the invention become apparent from the following description of preferred exemplary embodiments and also with reference to the figures; these show in FIG. 1 is a schematic graph in the form of a force-travel characteristic curve for elucidating the principle of function of the present invention;

FIG. 2 and FIG. 3 are possible schematic configurations of the assignment of the spring according to the invention to an MSM crystal body as an expansion unit in the exemplary embodiments shown;

FIG. 4 and FIG. 5 illustrate the schematic use of form springs for achieving a spring characteristic curve profile which is approximately horizontal in the stroke range;

FIG. 6 shows an alternative spring characteristic curve profile, which forms an extreme value and, in the exemplary embodiment which is shown of a typical clicker spring action, combines a degressive characteristic curve profile with a subsequent progressive profile;

FIG. 7 to FIG. 10 show various configurations of flat springs and the combinations thereof;

DETAILED DESCRIPTION

FIGS. 2 and 3 show possible mechanical design variants in order to allow the spring unit 40 (FIG. 2) as a tension spring or a flat spring unit 42 (FIG. 3) as a compression spring to interact with the MSM crystal body 10.

Figure 19:
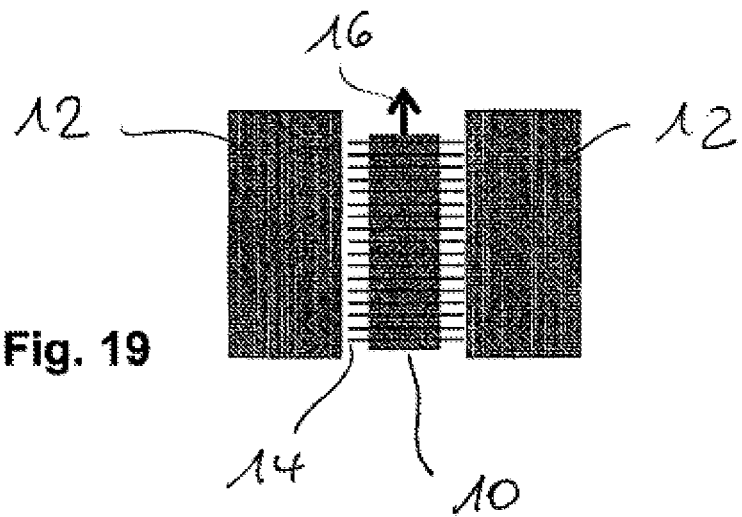
FIG. 19 and FIG. 20 show illustrations for elucidating the prior art consulted as being of the generic type.
Figure 20:
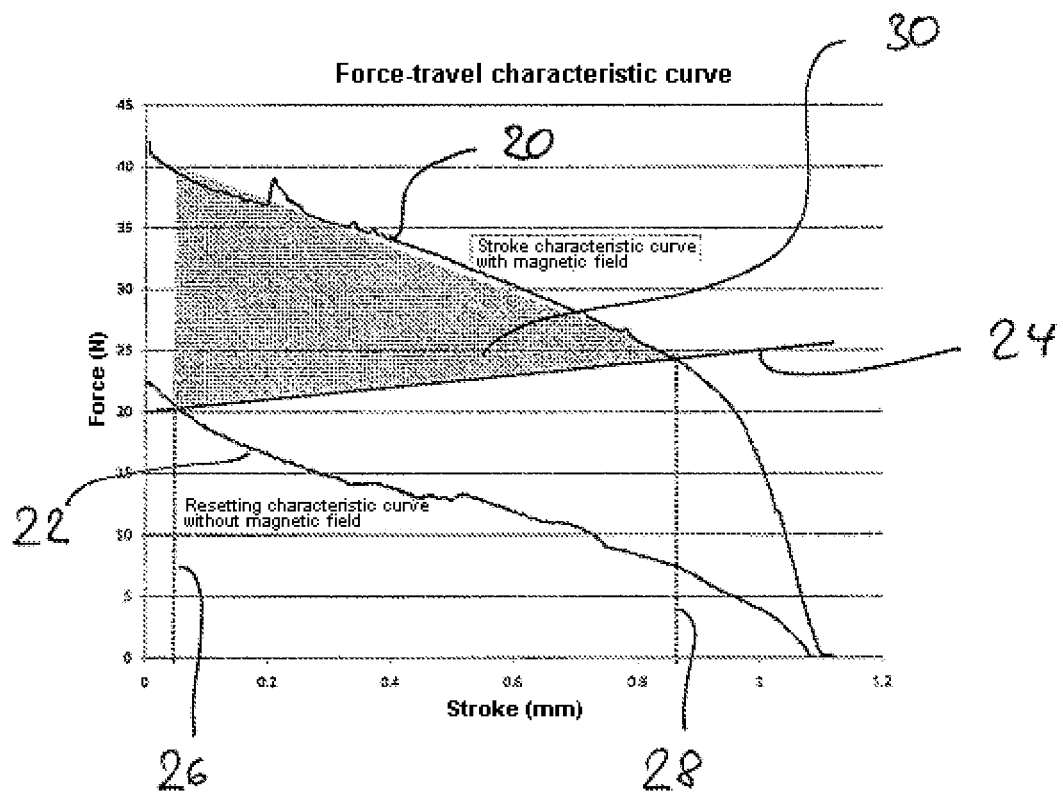

It becomes apparent that (beyond the fundamental advantages relating to the spring characteristic curves discussed above), for instance compared to a helical spring, an arrangement which optimizes installation space is made possible, either in terms of a minimized height or length (FIG. 2) or a minimized width (FIG. 3). Analogous to the illustration in FIG. 19, the arrangements in FIG. 2 and FIG. 3 would be subjected to magnetic fields running horizontally in the plane of the illustration.

FIG. 6 shows how an optimized spring characteristic curve profile can be used within an effective (predetermined) stroke range x to solve the problem addressed by the invention. The graph in FIG. 6 shows, with the characteristic curve 46, a typical profile of a so-called clicker diaphragm spring, which within the stroke range (x) initially behaves degressively and then in the last part of the stroke behaves progressively. It can be seen that, (cf. in this respect FIG. 1) with respect to a linear-rising Hooke's spring characteristic curve profile, not only the effective stroke is effectively extended, but in addition the characteristic curve 46 follows the upper expansion force profile of the MSM crystal in a virtually parallel manner, to this extent generating a force which is largely constant over the stroke range, with an in turn increased stroke work. Such a spring could be achieved typically by the configuration of the disk spring shown in FIG. 9, in which the individual free spring portions are appropriately mounted and prestressed for producing the turn-over, snap or return effect shown in FIG. 6.

Alternatives of such a flat spring configuration are shown by the suitably meandering or flat-helical spring variants in FIGS. 7 and 8, and a possible combination (by axial stratification) is shown in FIG. 10.

Figure 11:
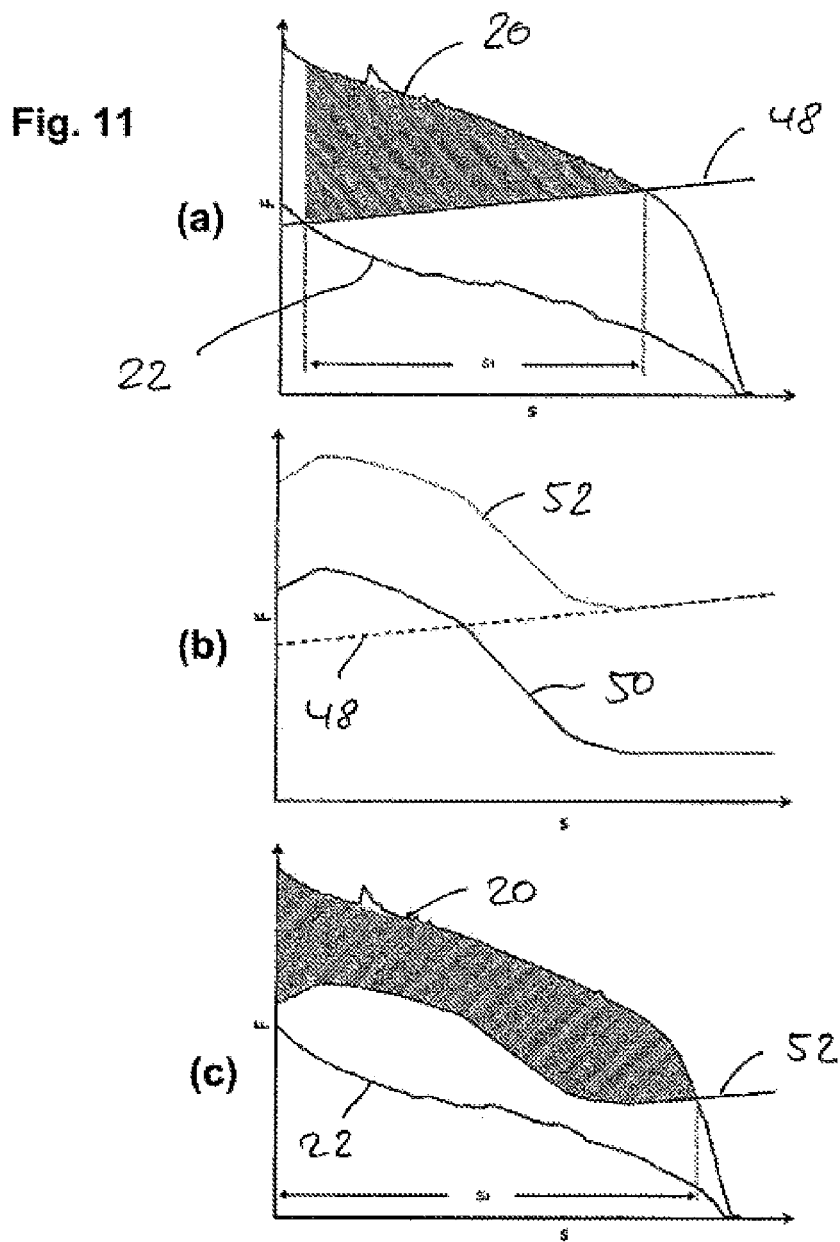
FIG. 11 shows three views for elucidating a resulting spring force characteristic curve, composed of a linear characteristic curve profile and also a characteristic curve profile which declines degressively in certain portions.

With reference to FIG. 11, and the individual illustrations (a) to (c) therein, it is shown that a spring combination, specifically a spring force addition of a conventional-linear spring (11a) with the profile 48 in connection with a non-linear, typically returning profile form 50 (11b) described above in the addition, yields the curve profile 52. Recorded in the expansion situation in FIG. 11c, this resulting spring force profile 52 in turn shows considerable improvements compared to the continuous-linear comparative profile in FIG. 11a, both in view of an extended effective expansion stroke and also concerning the achievable expansion work.

Figure 12:
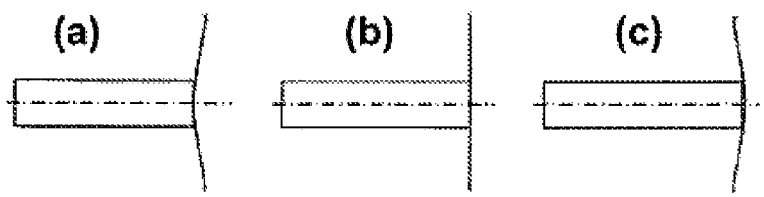
FIG. 12 is a schematic illustration of the interaction of an actuator crystal with a flat spring in various positions and, associated therewith, inversed directions of an input of spring force onto the MSM crystal body.
Figure 13:
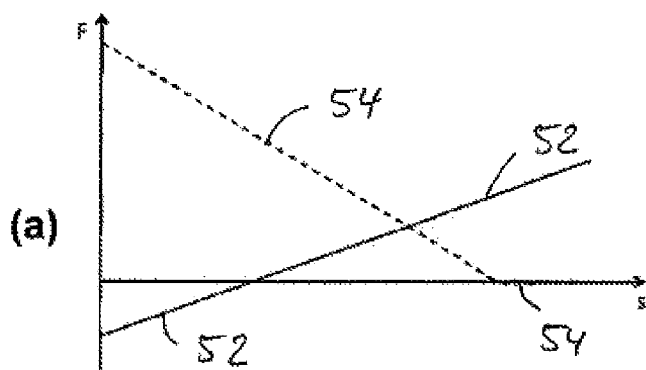
FIG. 13 show two spring characteristic curve illustrations for a spring unit formed from coupled springs.
Figure 13:
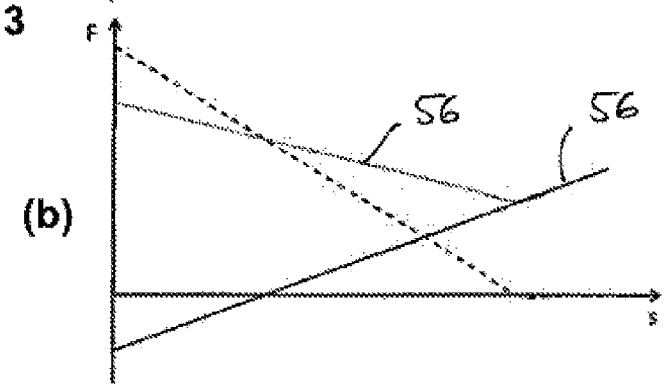
Figure 14:
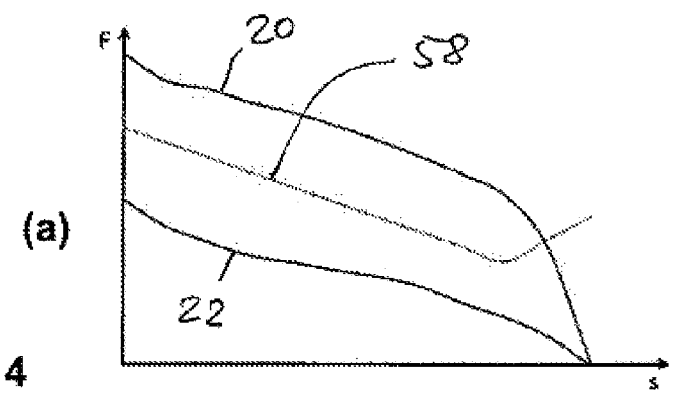
FIG. 14 shows two spring characteristic curve illustrations for a further exemplary embodiment of coupled springs.
Figure 14:
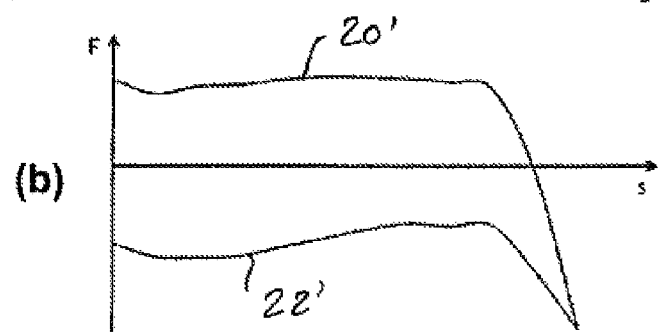

FIG. 12 shows, in schematic illustrations (a) to (c), the ways in which an elongated shape memory alloy crystal body can interact, as an actuator, with a flat spring shown in idealized form; thus, for instance, in the illustration in FIG. 12a a spring bearing against the crystal body 10 on the end face would initially exert a counterforce directed to the left on the crystal body expanding to the right, and move via a middle position (b) right up to a spring position in FIG. 12c, in which the counterforce in turn reaches the compressive force of the crystal body in this expansion position. This behavior is advantageous for exploiting the relatively large development of force of the crystal body in the case of small expansions, for temporarily storing the work performed thereby in part as spring energy and, for relatively large expansions where there is possibly a lack of force of the crystal body, in turn for releasing it and feeding it to an external actuating task.

The exemplary embodiments in FIGS. 13 to 16, too, show how spring force characteristic curves which result according to a development within the scope of the invention can be set and provided in a targeted manner by superposition or addition of individual profiles. Thus, for instance, FIG. 13a shows, with a spring provided with tension (force profile 54) and a spring provided with pressure (force profile 52) each with a linear characteristic curve, that a resulting spring force characteristic curve 56 having a preferred spring profile within the scope of the invention can be achieved from such a combination of two individual springs within the scope of the spring unit according to the invention. The tensile spring here loses force with an increasing expansion of the assigned shape memory alloy crystal body and thus with compression of the tensile spring, whereas the compressive spring increases in force at the same time.

In this case, it is possible, and not detrimental to the action achieved, that for instance the spring which provides the characteristic curve 52 even exerts a negative force, i.e. a tensile force in the expansion direction, in the left-hand (slightly expanded) stroke range; in the resulting characteristic curve 56, this effect has a balancing action in this respect.

In general terms, the present invention makes it possible to influence the force profile or the force development of the expansion unit (which is subjected to loading by the spring unit); thus, for instance, the comparison of FIG. 14a (insofar as it corresponds to FIG. 6) with FIG. 14b, in which in the graph the profiles of stroke force 20 or resetting force 22 have been revised about the spring force profile 58 by differential generation, shows how the resulting force profiles 20' and 22' are approximately constant virtually over the entire stroke range, to the extent that they can provide a downstream actuating partner with a constant actuating force in expansion operation over the stroke range.

Figure 15:
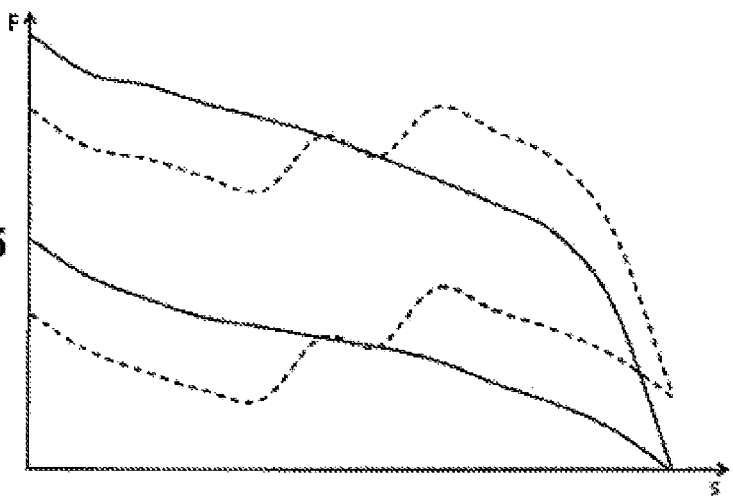
FIG. 15 and FIG. 16 show variants for further influencing the characteristic curves by the provision of various, varied spring types.
Figure 16:
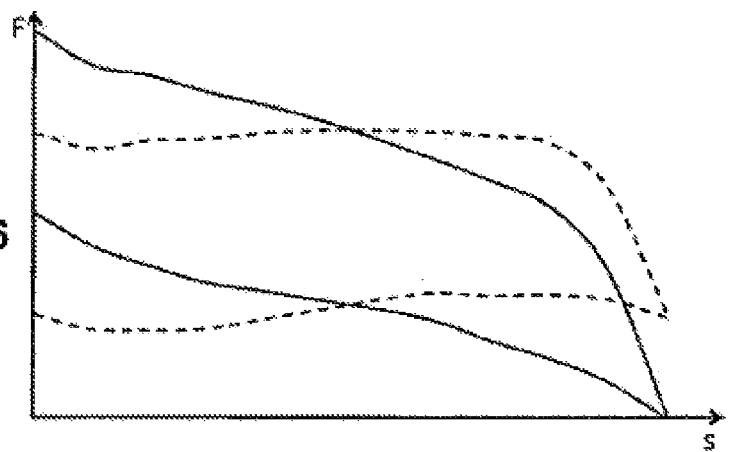

A variant in this respect is shown in FIG. 15 and FIG. 16: here, diaphragm springs were taken as a basis, with which in turn a force excess achieved at the start of the stroke is utilized for conversion into spring energy, which, at the end of the characteristic curve in the direction of the expansion position, can increase the force available.

This can also be realized, for example, by a combination of two helical or meandering springs, which work counter to one another in the respective direction of action thereof.

Figure 17:
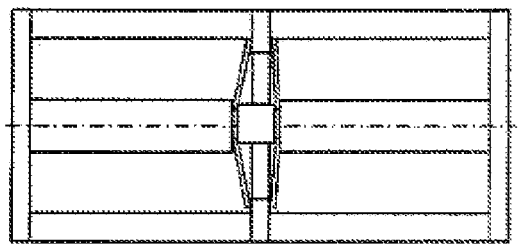
FIG. 17 is a schematic illustration of a further embodiment with two crystal bodies, which are directed towards one another along a common expansion axis and in the expansion directions thereof, with a spring unit arranged lying therebetween.
Figure 18:
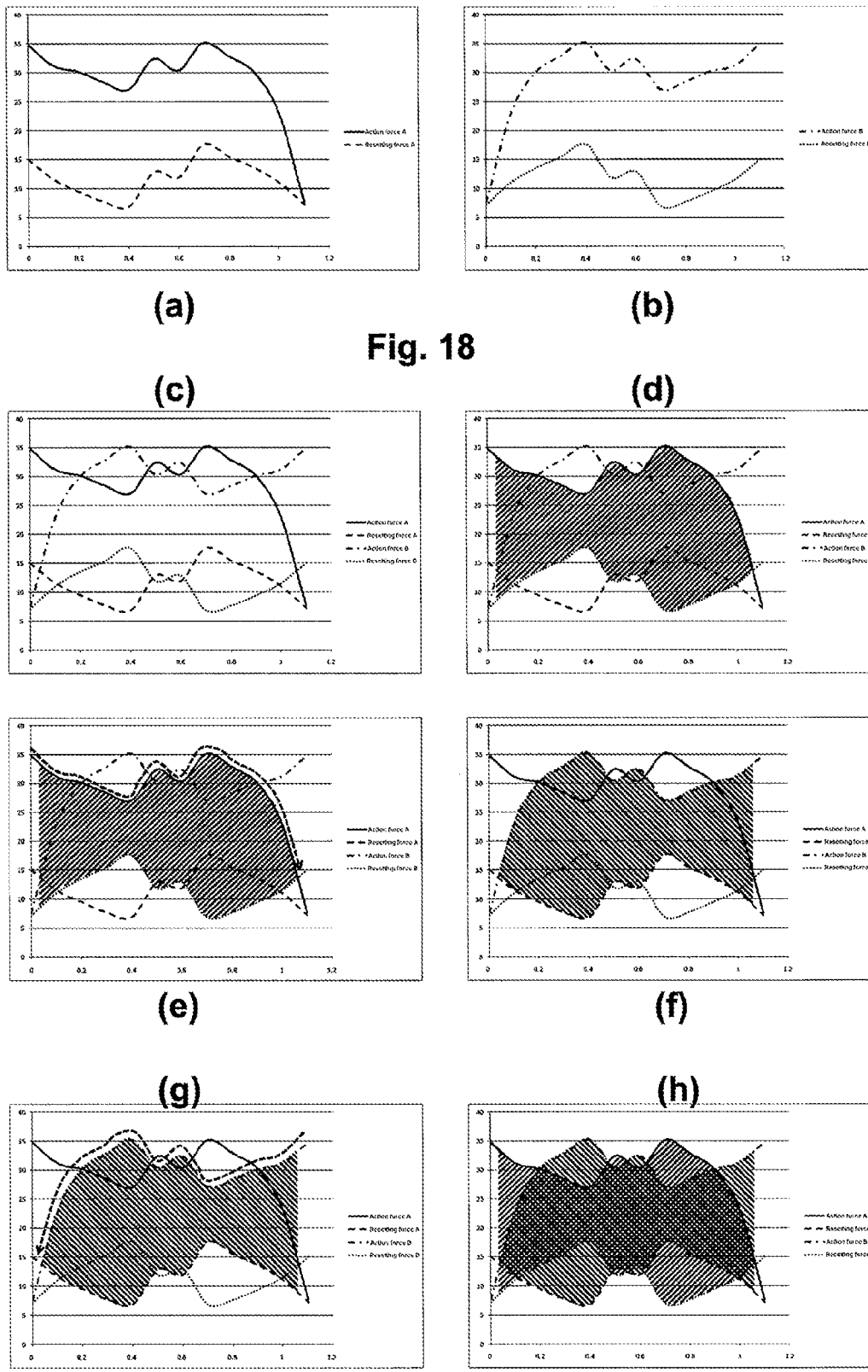
FIG. 18 shows illustrations for elucidating the force-movement behavior of the arrangement shown in FIG. 17 as a multistable push-push arrangement with individual illustrations of the individual actuators and the superpositions thereof.

An embodiment of the invention which is suitable for realizing a multistable push-push arrangement is shown in FIGS. 17 and 18: here, two actuators (10, 10a) are directed counter to one another and act along a common expansion axis counter to springs provided in the middle region, FIG. 18 showing a stroke work and respective force profiles. It is of interest that it is possible to achieve a plurality of positions which vary along the expansion direction and are stable owing to the snapping and folding behavior of the springs used.

In principle, in the case of such a system with two actuators directed towards one another as shown in FIG. 17 (without the provision of springs), one of these MSM actuators serves as a resetter, in the manner of a resetting spring, for the respective other MSM actuator.

If springs are then integrated in such a system, for instance springs for bringing about an above-described clicker effect (see the preceding description), the individual and combined curve profiles shown in FIG. 18 arise: the "force excess" with small elongations and the "force deficiency" with relatively large elongations of a pushing, expanding element can be compensated for in that the energy at first goes proportionally into the overriding of the assigned spring (for instance typically as far as the middle position), and this spring from there snaps over, i.e. it releases the energy again in the case of relatively large strokes and supports the expanding actuator. Thus, the force-travel behavior of the MSM element and of the assigned spring can be added in the consideration of the characteristic curves. If a second spring is then used for the second, opposing MSM element, this principle applies separately for initially both partners. The added characteristic curves acting counter to one another can then, depending on the spring characteristic curve(s), in turn ensure a greater net stroke and/or a greater net work, as the following illustrations in FIG. 18 show in collaboration.

Thus, for instance, (a) in FIG. 18 describes the stroke and also the resetting characteristic curve for the first, left-hand actuator A in FIG. 17, including the force contributions of the two springs (action force, solid line and resetting force, dashed line), just as graph (b) shows analogously said stroke and also resetting characteristic curve for the right-hand actuator B (FIG. 17) in isolation. Graph c) superposes said characteristic curves over the common movement stroke in the horizontal direction.

Graphs (d) and (e) for the actuator A describe the movement of said actuator in cooperation with partner B in such a way that the work which has arisen between the from the stroke force A and the (coupled) resetting force of the partner B as the shaded region, the arrow direction in (e) describing the expansion of actuator A. Contrarily and analogously, graphs (f) and (g) show action in the opposite direction, specifically stroke by actuator B with compression of actuator A and work described accordingly between these curves (see arrow direction in (g)). Graph (h) then superposes these respective work areas.

In practical operation of an embodiment according to FIG. 17, this firstly means that movement of a first actuator in a positive direction, for instance elongation, brings about compression of the respective other partner, and vice versa, assisted in each case by the assigned springs. Along the common movement axis, this principle is therefore effective right up to that position at which a generated force of the pushing, expanding element falls below the required resetting or compression force of the correspondingly compressed partner.

The invention claimed is:

1. Actuator device having an expansion unit, which comprises a magnetic shape memory alloy material, and a spring unit which interacts therewith in a restoring manner,
wherein at least one spring of the spring unit is assigned to the expansion unit, which is designed to perform an expansion movement along an expansion direction, in such a way that the spring can exert a restoring spring force counter to the expansion direction on the expansion unit, and
wherein the spring is set up and/or predetermined in its spring characteristic curve properties in such a way that a spring force profile of the spring unit along a stroke range, determined by an expansion force profile of the expansion unit and a restoring spring force profile, of the expansion movement does not form a continuously rising curve, and/or the spring force profile, with respect to a continuously rising curve, extends and/or increases the stroke range.

2. Device according to claim 1, wherein the spring force profile of the spring unit along the stroke range forms a curve having a pitch <=0 at least in certain portions in the stroke range and/or a falling curve.

3. Device according to claim 1, wherein the spring is a flat spring and/or a leaf spring and/or a disk spring and/or a meandering spring.

4. Device according to claim 1, wherein the spring is a plastic spring and/or a rubber spring and/or comprises a plastics material and/or rubber material for realizing a non-linear spring force profile.

5. Device according to claim 1, wherein the spring is provided so as to axially neighbor a crystal body which realizes the expansion unit and/or so as to laterally neighbor said crystal body along the expansion direction.

6. Device according to claim 1, wherein the spring unit has a plurality of individual springs, which interact with one another in such a way that the spring force profile of the spring unit arises as a resulting spring force profile of individual spring force profiles of the individual springs.

7. Device according to claim 6, wherein the individual springs have different spring types and/or spring construction modes and/or are designed with differing spring force profiles.

8. Device according to claim 1, wherein at least one spring of the spring unit is designed in such a way that the spring force profile has an extreme force value in the stroke range.

9. Device according to claim 1, wherein at least one spring of the spring unit is designed in such a way that a force counter to the restoring spring force is exerted on the expansion unit in a partial portion of the spring force profile in the stroke range.

10. Device according to claim 1, wherein the expansion unit is designed as an arrangement of two shape memory alloy material crystal bodies directed towards one another in a respective expansion direction, wherein at least one spring(s) of the spring unit is/are provided for interacting with both crystal bodies and is/are preferably arranged therebetween.

11. Process for producing an actuator device comprising an expansion unit, which comprises a magnetic shape memory alloy material, and also a spring unit which interacts therewith, and also for predetermining an effective expansion stroke and/or an effective expansion work of the actuator device, comprising the following steps:

providing the expansion unit which is set up to perform an expansion movement along an expansion direction, and assigning at least one spring, which exerts a restoring spring force counter to the expansion direction on the expansion unit, of the spring unit to the expansion unit in such a way that a spring force profile of the spring unit along a stroke range, determined by the expansion force profile of the expansion unit and a restoring spring force profile, of the expansion movement does not form a continuously rising curve, forms a curve having a pitch <=0 at least in certain portions in the stroke range and/or a degressively falling curve.

12. Process according to claim 11, wherein the spring force profile of the spring unit along the stroke range does not form a continuously linearly rising curve.

13. Process according to claim 11, wherein the spring force profile of the spring unit along the stroke range forms a curve having a pitch <=0 at least in certain portions in the stroke range and/or a degressively falling curve.

14. Process according to claim 11, wherein the spring unit is set up in such a way that the spring force profile of the spring unit runs parallel to the expansion force profile of the expansion unit at least in certain portions in the stroke range.

15. Process according to claim 14, wherein the spring unit is selected and/or has a predetermined spring force profile such that the spring force profile of the spring unit runs parallel to the expansion force profile of the expansion unit at least in certain portions in the stroke range.

* * * * *